United States Patent
Huisenga et al.

(10) Patent No.: US 7,098,798 B2
(45) Date of Patent: Aug. 29, 2006

(54) PROCESS DEVICE WITH LOOP OVERRIDE

(75) Inventors: Garrie Huisenga, Chaska, MN (US); Randy Longsdorf, Chaska, MN (US)

(73) Assignee: Rosemount Inc., Eden Prairie, MN (US)

( * ) Notice: Subject to any disclaimer, the term of this patent is extended or adjusted under 35 U.S.C. 154(b) by 271 days.

(21) Appl. No.: 10/733,558

(22) Filed: Dec. 11, 2003

(65) Prior Publication Data

US 2005/0030186 A1 Feb. 10, 2005

Related U.S. Application Data

(63) Continuation-in-part of application No. 10/635,944, filed on Aug. 7, 2003.

(51) Int. Cl.
*G08B 21/00* (2006.01)

(52) U.S. Cl. .................. 340/635; 340/508; 340/664; 340/3.44

(58) Field of Classification Search .................. 340/635
See application file for complete search history.

(56) References Cited

U.S. PATENT DOCUMENTS

| | | | |
|---|---|---|---|
| 3,959,772 A | 5/1976 | Wakasa et al. ............... 340/167 |
| 4,020,416 A | 4/1977 | Ottos ........................ 324/703 |
| 4,086,570 A | 4/1978 | Wakasa et al. ............... 340/172 |
| 4,403,297 A | 9/1983 | Tivy ........................... 364/579 |
| 4,804,958 A * | 2/1989 | Longsdorf ............. 340/870.07 |
| 5,036,886 A | 8/1991 | Olsen et al. ........... 137/625.65 |
| 5,223,798 A | 6/1993 | McGinnis et al. .......... 324/713 |
| 5,339,025 A | 8/1994 | Jones et al. ................. 324/713 |
| 5,382,912 A | 1/1995 | Blain ......................... 324/713 |
| 5,386,188 A | 1/1995 | Minneman et al. ......... 327/704 |
| 5,416,409 A | 5/1995 | Hunter .................... 324/158.1 |
| 5,481,200 A | 1/1996 | Voegele et al. ............. 324/718 |
| 5,956,663 A * | 9/1999 | Eryurek ...................... 702/183 |
| 6,014,612 A * | 1/2000 | Larson et al. ............... 702/183 |
| 6,176,247 B1 | 1/2001 | Winchcomb et al. ......... 137/14 |
| 6,445,963 B1 * | 9/2002 | Blevins et al. ................ 700/44 |
| 6,512,358 B1 * | 1/2003 | Klofer et al. ............ 324/103 P |
| 2002/0121910 A1 | 9/2002 | Rome et al. ................. 324/718 |

FOREIGN PATENT DOCUMENTS

| | | |
|---|---|---|
| DE | 42 09 785 A1 | 9/1993 |
| DE | 298 24 256 U1 | 7/2001 |
| EP | 1 396 771 A1 | 3/2004 |
| GB | 2224853 | 5/1990 |
| GB | 2260416 | 4/1993 |
| JP | 55-23638 | 2/1980 |
| WO | WO 98/29785 | 7/1998 |
| WO | WO 00/79352 A2 | 12/2000 |
| WO | WO 03/040657 A2 | 5/2003 |

(Continued)

OTHER PUBLICATIONS

U.S. Appl. No. 10/635,944, filed Aug. 7, 2003.

(Continued)

*Primary Examiner*—Daniel Wu
*Assistant Examiner*—Eric M. Blount
(74) *Attorney, Agent, or Firm*—Westman, Champlin & Kelly, P.A.

(57) ABSTRACT

A process device for use in a process control system includes output circuitry configured to couple to a process control loop. The output circuitry controls electrical current through the loop. Loop override circuitry is configured to override operation of the output circuitry and set the electrical current in the loop to a desired level.

50 Claims, 6 Drawing Sheets

FOREIGN PATENT DOCUMENTS

| | | |
|---|---|---|
| WO | WO 03/040851 A2 | 5/2003 |
| WO | WO 03/060851 A1 | 7/2003 |

OTHER PUBLICATIONS

U.S. Appl. No. 10/719,163, filed Nov. 21, 2003.
"Functional Safety and Safety Integrity Levels", *Applications Note*, Apr. 2002, pp. 1-6.
Article entitled "Safety Field^IT 2600T Pressure Transmitter Family", *ABB Instrumentation Spa*, 29 pages.
Search Report "Notification of Transmittal of The International Search Report or the Declaration", PCT/US2004/025289.
U.S. Appl. No. 10/829,124, filed Apr. 21, 2004.
U.S. Appl. No. 10/866,930, filed Jun. 14, 2004.
U.S. Appl. No. 10/955,790, filed Sep. 30, 2004.
Fieldvue Instruments, article entitled "Improving Safety Instrumented System Reliability", *Emerson Process Management*, Feb. 2002, 8 pages.
Search Report "Notification of Transmittal of the International Search Report or the Declaration", PCT/US2004/037289.
"Safety Networks—Increase Productivity, Reduce Work-Related Accidents and Save Money", www.can-cia.de/devicenet/CIPWhite_paper_English.pdf, copyright © 2003 ODVA, 8 pages.

* cited by examiner

PROCESS DEVICE WITH LOOP OVERRIDE

The present application is a continuation-in-part of and claims priority of U.S. patent application Ser. No. 10/635,944, filed Aug. 7, 2003 the content of which is hereby incorporated by reference in its entirety.

BACKGROUND OF THE INVENTION

The present invention relates to process devices of the type used in industrial processes. More particularly, the present invention relates to devices which control electrical current in a process control loop of such process devices.

Field devices such as process controllers, monitors and transmitters, are used in the process control industry to remotely control, monitor or sense a process variable. For example, a process variable may be transmitted to a control room by a transmitter for use in controlling the process or for providing information about process operation to a controller. For example, information related to pressure of process fluid may be transmitted to a control room and used to control the process, such as oil refining.

One typical prior art technique for transmitting information involves controlling the amount of current flowing through a process control loop. Current is supplied from a current source in the control room and the transmitter controls the current from its location in the field. For example, a 4 mA signal can be used to indicate a zero reading and a 20 mA signal can be used to indicate a full scale reading. More recently, transmitters have employed digital circuitry which communicates with the control room using a digital signal which is superimposed onto the analog current signal flowing through the process control loop. One example of such a technique is the HART® communication protocol developed by Rosemount Inc. The HART® protocol and other such protocols typically include a set of commands or instructions which can be sent to the transmitter to elicit a desired response, such as transmitter control or interrogation.

Fieldbus is a communications protocol proposed by the Fieldbus Foundation and is directed to defining a communications layer or protocol for transmitting information on a process control loop. In the Fieldbus protocol, the current flowing through the loop is not used to transmit an analog signal. Instead, all information is digitally transmitted by modulating current flowing in the process control loop. Further, the Fieldbus Standard, and a standard known as Profibus, allow transmitters to be configured in a multi-drop configuration in which more than one transmitter is connected on the same process control loop. Other communication protocols include the MODBUS® protocol and Ethernet. In some configurations, two, three, four or any number of wires can be used to connect to the process device, including non-physical connections such as RF (radio frequency).

Some process transmitters are also capable of transmitting an alarm signal which can provide an indication that the process variable measurement is saturated (i.e. process upset). One type of alarm signal fixes the current through the loop at predetermined levels or outside of predetermined threshold values. For example, one type of alarm signal is a current level which is greater than 21 mA or less than 3.8 mA can be used to send a "high alarm" or a "low alarm", respectively. The alarm signal can be sent by the transmitter upon the occurrence of an alarm condition.

SUMMARY

A device for use in a process control system includes output circuitry configured to couple to the process control loop and control electrical current through the loop. Loop override circuitry is configured to override operation of the output circuitry and set the electrical current in the loop to a desired level.

DETAILED DESCRIPTION

The present invention provides loop override circuitry which is configured to override operation of output circuitry in a process device. The invention can be implemented in any process device which is used to control current in a process control loop and is not limited to the illustrative process device discussed herein. For example, one process device described herein is a transmitter which includes a sensor for sensing a process variable. However, it is not necessary for a process device to sense a process variable to implement various aspects of this invention. The loop override circuitry is capable of sending an alarm signal (or other) on a process control loop, even upon a failure of other circuitry in the process device. This allows the device to send an alarm signal which might otherwise go undetected (unannounced). In another embodiment, a technique is provided for detecting the loss of the ability of the device to control the loop current.

Figure 1:
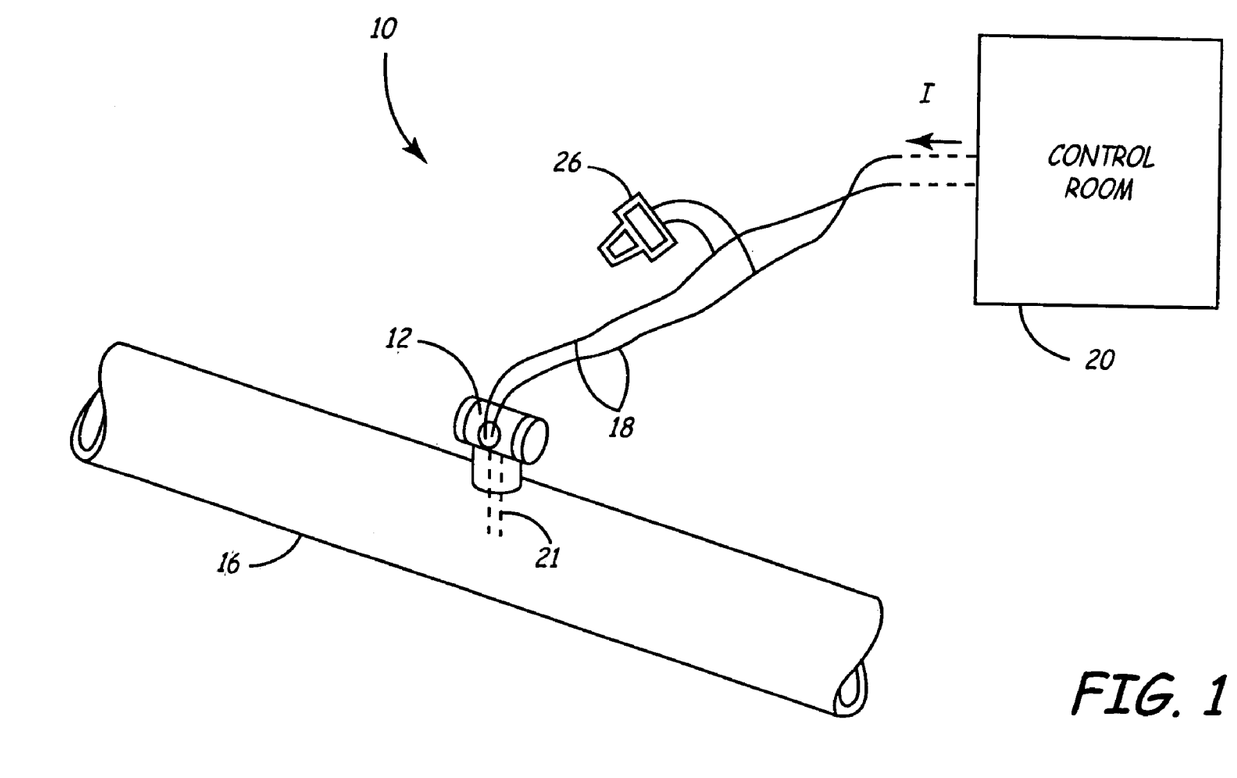
FIG. 1 is a diagram which illustrates a process control system including a process device which couples to a process control loop.

FIG. 1 is a diagram of process control system 10 which includes a transmitter 12 connected to process pipe 16. Transmitter 12 is coupled to a two-wire process control loop 18 which operates in accordance with the FOUNDATIONS Fieldbus, Profibus, or HART® standard. However, the invention is not limited to these standards or a two-wire configuration. Two-wire process control loop 18 runs between transmitter 12 and the control room 20. In an embodiment in which loop 18 operates in accordance with the HART® protocol, loop 18 can carry a current I which is representative of a sensed process variable. Additionally, the HART® protocol allows a digital signal to be superimposed on the current through loop 18 such that digital information can be sent to or received from transmitter 12. When operating in accordance with the Fieldbus Standard, loop 18 carries a digital signal and can be coupled to multiple field devices such as other transmitters.

Figure 2:
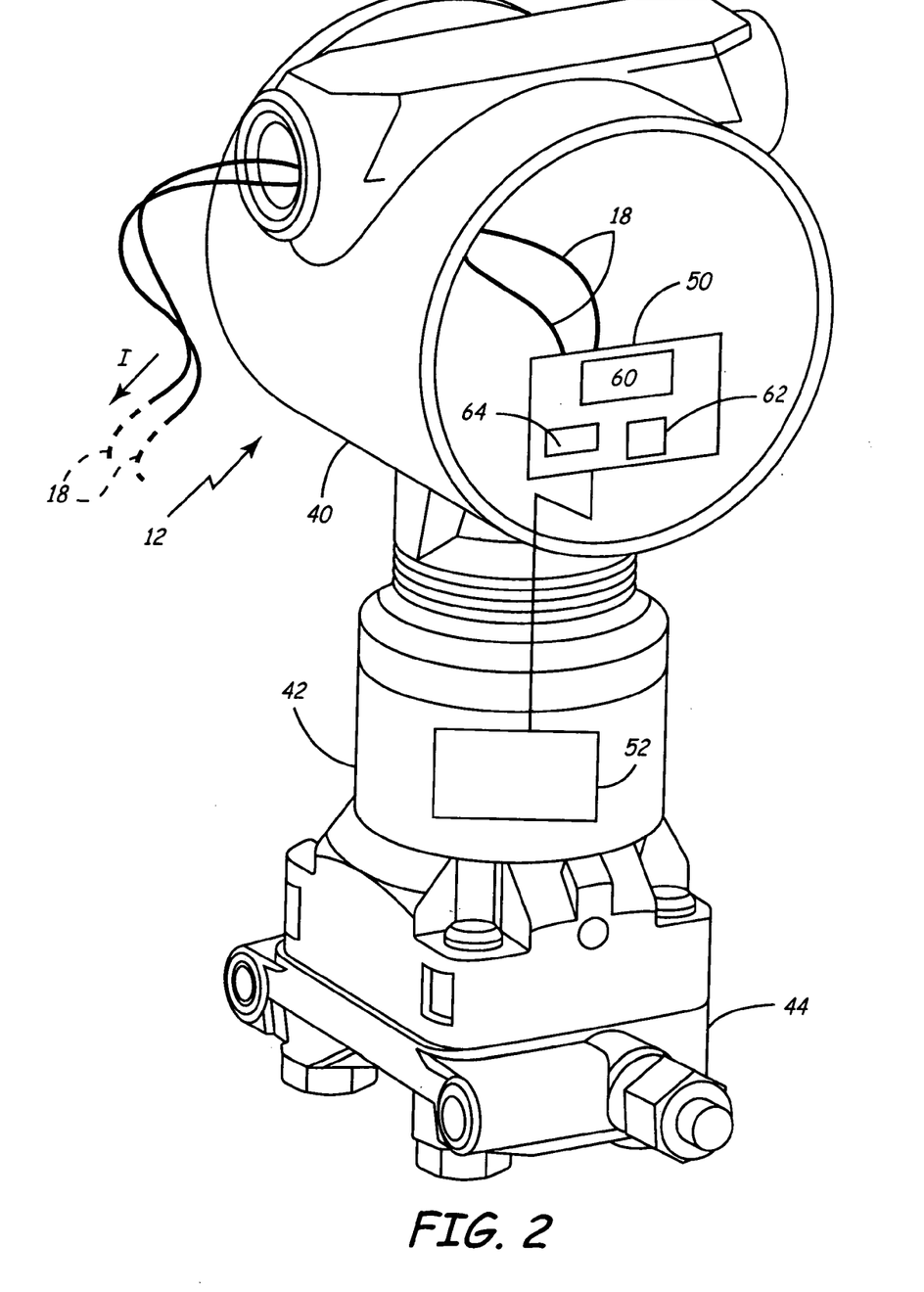
FIG. 2 is a perspective view which illustrates within the process device of FIG. 1.

FIG. 2 is a perspective view of transmitter 12 which shows one example configuration of circuitry blocks carried therein. In this example embodiment, transmitter 12 includes a feature module 40 which couples to a sensing module 42. The sensing module 42 couples to process piping 16 (shown in FIG. 1) through manifold process coupling 44.

Feature module 40 includes feature module electronic circuitry 50 which couples to sensing module electronic circuitry 52 carried in sensing module 42. Typically, the sensing module electronic circuitry 52 couples to a process variable sensor, for example sensor 21 shown in FIG. 1, which is used to sense a process variable related to operation of the process. Feature module electronic circuitry 50 includes output circuitry 60, loop override circuitry 62, and diagnostic circuitry 64. The circuitry 60, 62 and 64 can be implemented in hardware, software or a hybrid combination of the two and can be located anywhere within transmitter 12.

During operation, output circuitry 60 controls the value of the current I flowing through loop 18 to represent, for example, a measured process variable. This can be used to monitor or control operation of an industrial process. In some applications, output circuitry 60 is also used to provide power to circuitry within transmitter 12 which is generated using power received over loop 18. In some applications, such as for obtaining a Safety Integrity Level (SIL) certification, it is necessary for the transmitter 12 to meet certain reliability criteria. For example, in order to ensure that a process is shut down upon a failure or impending failure, some certifications require that an alarm signal be properly sent so that a safety shut down can occur even if some of the components have failed in transmitter 12.

According to one aspect of the present invention, diagnostic circuitry 64 may provide diagnostics which are used to detect internal failure modes of transmitter 12 and/or external influences such as starvation or EMI, which are described later. The diagnostic circuitry 64 can detect a failure or impending failure of the output circuitry 60. The diagnostic circuitry 64 is used to activate loop override circuitry 62 which overrides operation of output circuitry 60 and places an alarm current level on loop 18. For example, the loop override circuitry 62 can set the loop current to a predetermined value. In a 4–20 mA current loop, the current I can be set to a value less than 3.8 mA or greater than 21 mA by loop override circuitry 62 to thereby send an alarm signal on loop 18. These current levels are referred to as "low alarm" and "high alarm", respectively. However, the current can be set to any level as desired, including to a level which represents a process variable.

Figure 3:
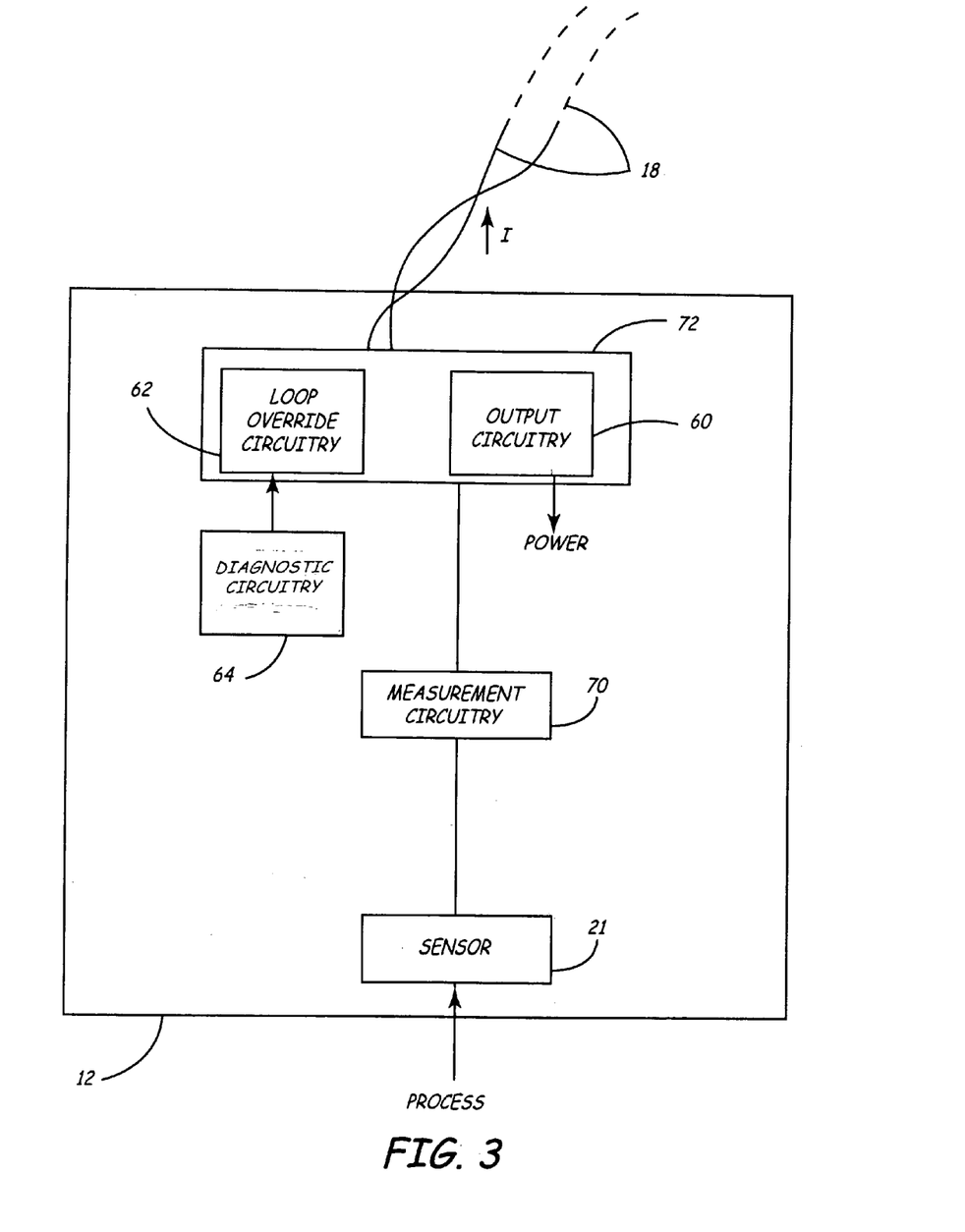
FIG. 3 is a simplified block diagram of circuitry in the process device.

FIG. 3 is a simplified block diagram of transmitter 12. As shown in FIG. 3, transmitter 12 includes measurement circuitry 70 which couples to process variable sensor 21. Circuitry 70 can be included on sensor module circuitry 52 shown in FIG. 2. An output stage 72 connects to measurement circuitry 70 and is configured for sending (and, in some embodiments, receiving) information on process control loop 18. The output stage 72 includes loop override circuitry 62 and output circuitry 60. However, circuitry 60 and 62 can be configured in accordance with other embodiments. The measurement circuitry 70 is configured to provide initial processing of process variables sensed by sensor 21. The implementation of measurement circuitry 70 frequently includes a microprocessor. The microprocessor may also be used to implement other circuit functionality shown in FIG. 3.

During normal operation, the process variable sensed by sensor 21 is converted into an analog current level or a digital signal for transmission on process control loop 18 using output circuitry 60. However, when an alarm condition is sensed by diagnostic circuitry 64, loop override circuitry 62 is configured to override the output generated by output circuitry 60 and drive the current level I carried in loop 18 to a predetermined alarm level, for example, above or below a predetermined threshold level. The loop override circuitry 62 can be connected in series or parallel with output circuitry 60 or included in circuitry 60. Other configurations can also be used. In some embodiments, the loop override circuitry 62 is configured to switch off or otherwise disconnect output circuitry 60 or other components in transmitter 12.

The diagnostic circuitry 64 can sense an alarm condition as desired by the user. The diagnostic circuitry 64 can operate in accordance with any diagnostic technique and is not limited to those set forth specifically herein. For example, the diagnostic circuitry 64 can be configured to sense the quiescent current draw of individual components within transmitter 12, or of all of the components within transmitter 12. The onset of many failure mechanisms can be recognized by an increase in the quiescent "operating" current level. This is described in U.S. patent application Ser. No. 10/635,944, filed Aug. 7, 2003, entitled PROCESS DEVICE WITH QUIESCENT CURRENT DIAGNOSTICS. Example failures which can be detected based upon quiescent current draw include latent failures due to electrostatic discharge damage, component damage due to lightning or transient electrical events, leakage in semiconductors, for example zener diodes, leakage of filter components such as capacitors, leakage due to dendrite growth or corrosion, or other failures or impending failures.

A quiescent current diagnostic capability allows prediction and/or detection of the inability to control process loop current I, due to increases in quiescent current, thereby initiating loop override circuitry 62.

The quiescent current diagnostic is particularly advantageous for devices which communicate exclusively in a digital format, for example Fieldbus. On such as a device, if the quiescent current level prevents transmission of a digital signal, the device has no other means by which to transmit process-related information. Therefore, with such a quiescent current diagnostic configuration, transmitter 12 can transmit an indication of an impending failure, prior to ultimate failure. In one embodiment, loop override circuitry 62 can disconnect transmitter 12 communication circuits from process control loop 18. In another embodiment, when quiescent current draw has reached a level at which transmitter 12 or process control loop 18 will cease to function, loop override circuitry 62 can disconnect transmitter 12 from process control loop 18, so that process control loop 18 can continue to operate.

Figure 4:
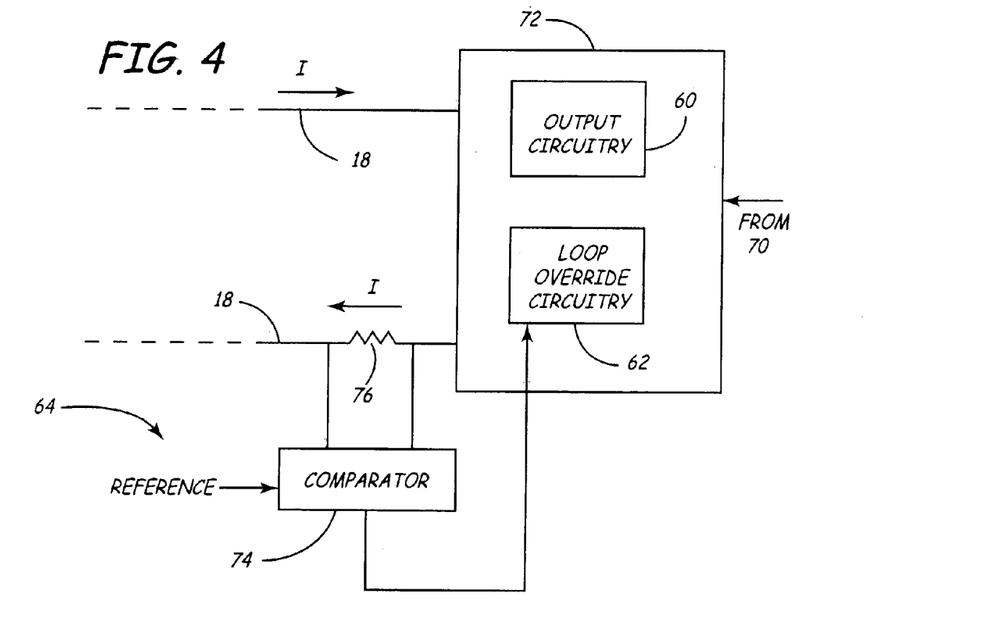
FIG. 4 is a simplified block diagram of circuitry including a comparator for implementing diagnostic circuitry.

FIG. 4 is a simplified block diagram showing one embodiment of diagnostic circuitry 64. In FIG. 4, a comparator 74 is used to sense a voltage drop across a resistor 76 which is connected in series with loop current I. The comparator 74 can be configured to detect variations in the loop current beyond predetermined threshold levels and responsively provide a signal to the loop override circuitry 62. In response to the signal from comparator 74, loop override circuitry 62 overrides the normal operation of output circuitry 60 and drives the loop current I to an alarm level. The comparator 74 can comprise multiple comparators, for example, to detect current excursions beyond an upper and a lower threshold. The reference input to comparator 74 can be generated using any appropriate means, for example, a resistor ladder network, diode, or other techniques. The output of comparator 74 is illustrated as coupled to loop override circuitry 62. The loop override 62 can include a microprocessor which receives the output from comparator 74, or the output from comparator 74 can be used to directly control the loop override circuitry 62 electrical components.

Figure 5:
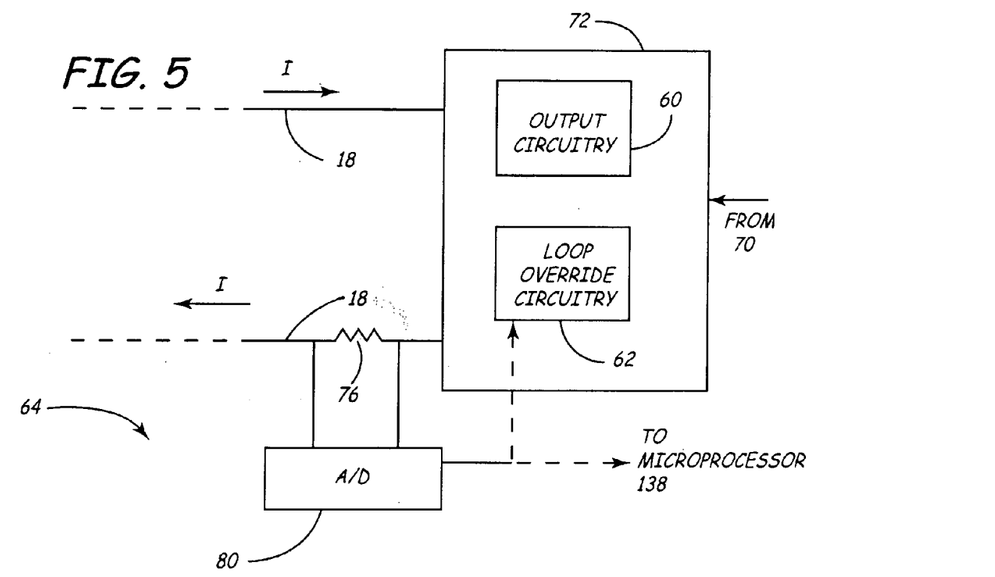
FIG. 5 is a simplified block diagram of circuitry including an analog to digital converter for implementing diagnostic circuitry.

FIG. 5 is a simplified diagram showing another embodiment of the present invention in which diagnostic circuitry 64 is formed using an analog to digital converter 80 connected across the resistor 76. As discussed above, resistor 76 is coupled in series with loop 18 such that the voltage drop across resistor 76 is indicative of the loop current I. The output from analog to digital converter 80 can couple to loop override circuitry 62 or to a microprocessor 138 shown in FIG. 7. The microprocessor compares the digitized loop current value with thresholds stored in a memory and responsively activates loop override circuitry 62 to drive the loop current to an alarm signal level. The threshold values can be, for example, stored in a memory. Additionally, the diagnostic circuitry 64 can monitor the loop current I to detect trends in the loop current value. Aberrations in the loop current trends, for example, those due to starvation or electromagnetic interference (EMI) can be used to activate the loop override circuitry 62. If there is insufficient terminal voltage (starvation), output circuitry 60 may be unable to achieve a desired output. The presence of significant levels of electromagnetic interference may cause a shift in loop current I. In another example, the microprocessor can compare the digitized loop current value with expected loop current value. For example, the expected loop current value can be the value that the loop current should be set to for a particular value of the sensed process variable. If the sensed loop current value varies from the expected loop current value by more than a predetermined amount, for example a percentage, the microprocessor can trigger operation of the loop override circuitry 62.

Figure 6A:
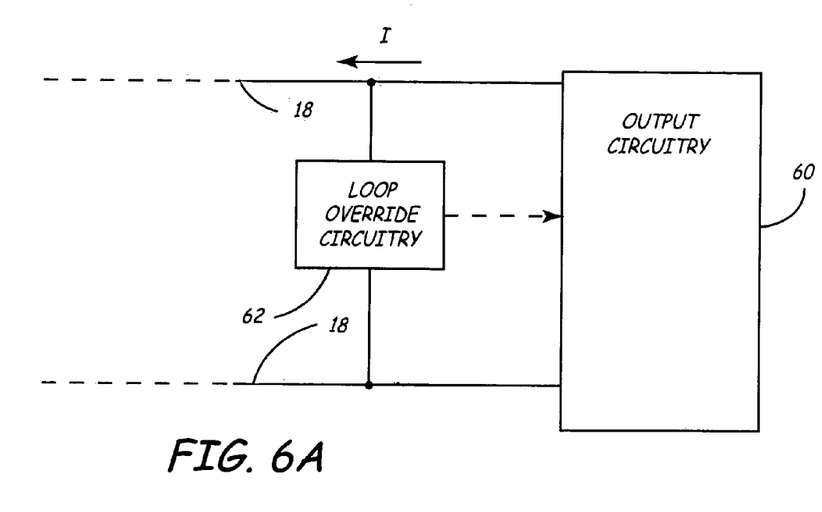
FIG. 6A is a simplified electrical diagram showing loop override circuitry connected in parallel with output circuitry.
Figure 6B:
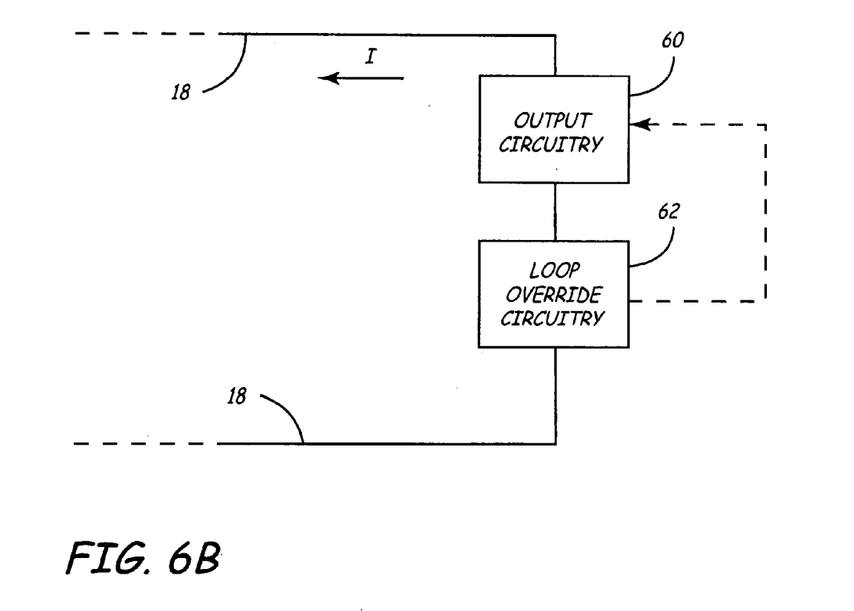
FIG. 6B is a simplified electrical diagram showing loop override circuitry connected in series with output circuitry.

FIGS. 6A and 6B are two simplified block diagrams showing example configurations of output circuitry 60 and loop override circuitry 62. In FIG. 6A, loop override circuitry 62 is connected in parallel with output circuitry 60. An optional connection between loop override circuitry 62 and output circuitry 60 is shown which, in some embodiments, allows loop override circuitry 62 to shut off or otherwise disconnect output circuitry 60 from loop 18. In FIG. 6B, loop override circuitry 62 is illustrated as connected in series with output circuitry 60. An optional connection between loop override circuitry 62 and output circuitry 60 can be used to disconnect output circuitry 60 from loop 18 or bypass output circuitry 60. Other configurations can also be used such as a series-parallel connection, or embodiments in which output circuitry 60 and loop override circuitry 62 share some or all components. The device can be electrically disconnected from the loop, for example, by using one or more switches or fuses.

Once the inability to control the loop current is detected by the diagnostic circuitry 64, the loop override circuitry 62 is used to ensure that the transmitter 12 outputs a valid alarm signal. For example, when the loop override circuitry 62 is connected in parallel with output circuitry 60 as shown in FIG. 6A, the loop override circuitry 62 can shunt additional current such that the total loop current is greater than 21 mA to indicate a high alarm signal. In another example embodiment, the loop override circuitry 62 includes a disconnect mechanism such that the offending circuitry can be disconnected thereby allowing signaling of either a high alarm signal or a low alarm signal. In such an embodiment, the disconnect circuitry can be connected in series with the offending circuitry. In another embodiment, loop override circuitry 62 can include a second (or backup) loop control circuit, which can be used to control loop current if desired. In another example embodiment, the diagnostic circuitry 64 includes a watch dog circuit 150 which must be periodically triggered by a microprocessor or other means within the transmitter 12. The watchdog circuit 150 can detect failures including hardware or software failures. If the watch dog circuit 150 is not triggered within the preset time limit, the loop override circuitry 62 can be activated to thereby send a high or low alarm signal.

Figure 7:
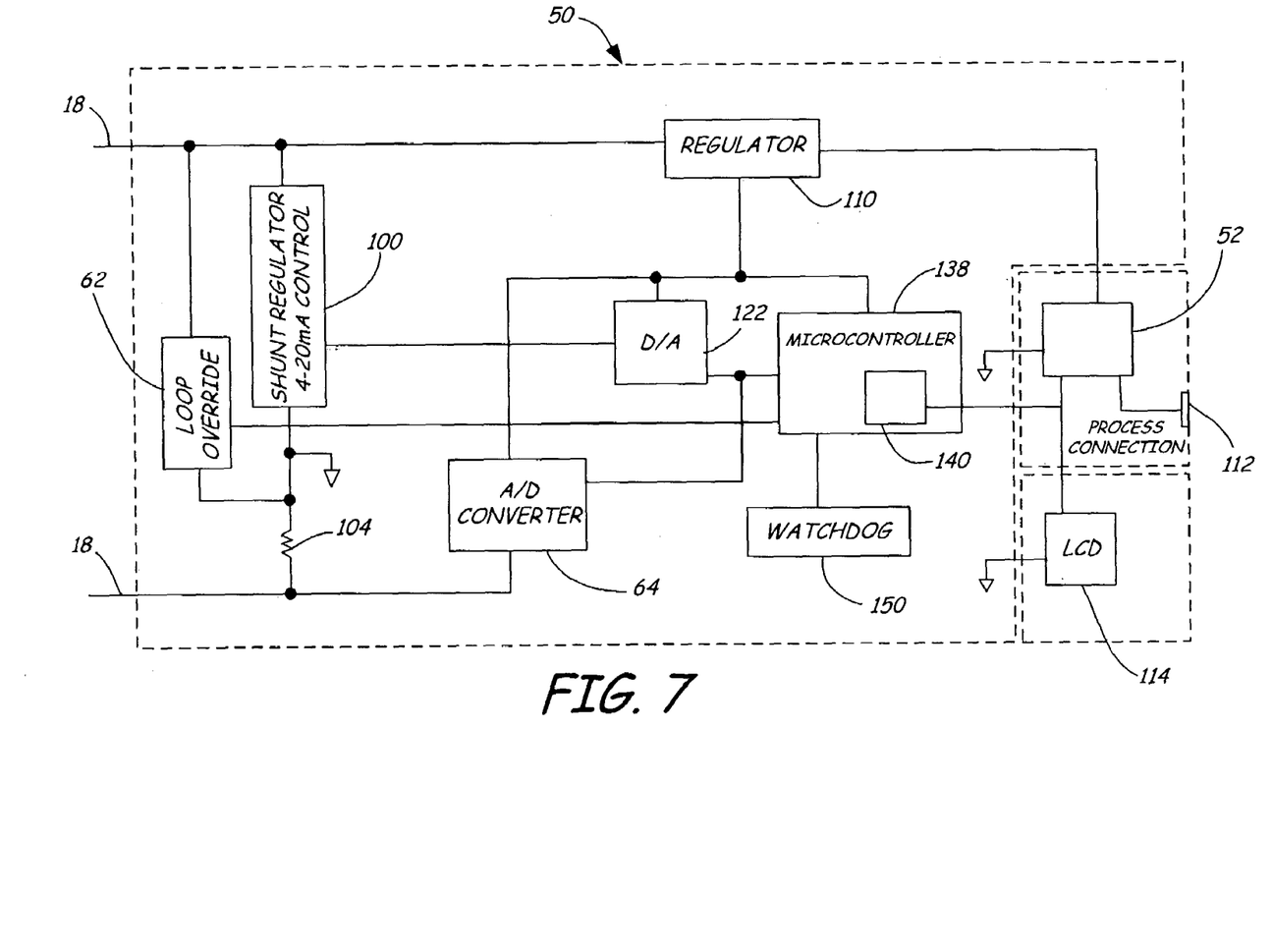
FIG. 7 is a more detailed block diagram of electrical circuitry in the process device of FIG. 1.

FIG. 7 is a more detailed block diagram showing one example of circuitry in transmitter 12. In FIG. 7, feature module electronics 50 is shown coupled to two wire process control loop 18 through a shunt regulator 100 and a loop feedback resistor 104. A power regulator 110 couples to sensor module electronics 52. Sensor module electronics 52 is also shown coupled to the process through a process variable sensor 112. An optional output display 114 is also shown.

The loop override circuitry 62 can be partially implemented in microcontroller 138 which couples to a digital to analog (D/A) converter 122 and an analog to digital (A/D) converter 64. Analog to digital converter 64 is configured to measure the loop current and can also implement the functionality of diagnostic circuitry 64.

In operation, the microcontroller 138 is configured to control the current I through loop 18, and any digital data modulated onto that current, using D/A 122 and shunt regulator 100. The analog to digital converter 64 provides an output which is indicative of the current I flowing through loop 18. The analog to digital converter 64 can also be connected to provide an output related to the quiescent (operating) current drawn by transmitter 12 or components within transmitter 12. The microcontroller 138 includes a memory 140 which can contain threshold values used in detecting an alarm condition. By periodically comparing the measured loop current with the threshold values stored in memory 140 or with the expected value of the loop current based upon the sensed process variable, the microcontroller 138 can determine if an alarm condition has occurred. Of course, other alarm conditions can be detected as desired and the invention is not limited to those set forth herein.

Upon the detection of an alarm condition, the microcontroller 138 transmits an alarm signal on process control loop 18 by activating loop override circuitry 62. The current I flowing through loop 18 is then set to a fixed current level. In some embodiments, circuitry within the device can be disconnected or shut off in order to provide enough power to other circuitry to provide a desired output. One technique to provide a loop override is to disconnect the device, or otherwise take the device offline from the process control loop.

FIG. 7 also illustrates a watch dog circuit 150 coupled to microcontroller 138. The watch dog circuit 150 must be periodically triggered by microcontroller 138. If microcontroller 138 stops triggering watch dog circuit 150, it can be assumed that a failure has occurred. Examples include, but are not limited to, improper program flow, microprocessor or memory failure, clock errors, etc. If watch dog circuit 150 is not triggered, watch dog circuit 150 sends a signal to loop override circuitry 62 to cause loop override circuitry 62 to drive an alarm current level on the process control loop 18.

Although the present invention has been described with reference to preferred embodiments, workers skilled in the art will recognize that changes may be made in form and detail without departing from the spirit and scope of the invention. The above description illustrates the invention in one example configuration and any appropriate process control loop may be used such as 4–20 mA, 2, 3, or 4 wire loop, multi-drop loop and a loop operating in accordance with Fieldbus, Profibus, HART® or other communication protocol which transmits process-related information by controlling current flow in a process control loop. The present invention can be particularly useful in a Safety Instrumented System (SIS) configuration which provides an additional safety layer to a process control loop. The invention can provide a technique of improving the Safety Integrity Level (SIL) rating of a process device. These techniques can be used to convert an undetected failure or potentially unsafe condition into a detected failure which occurs in accordance with a safe condition. Thereby increasing the Safe Failure Fraction (SFF) for process devices used in Safety Instrumented Systems (SIS). The present invention can be used in conjunction with techniques set forth in U.S. application Ser. No. 10/719,163, filed Nov. 21, 2003 and entitled PROCESS DEVICE WITH SUPERVISORY OVERLAYER.

What is claimed is:

1. A process device for use in a process control system, comprising:
    output circuitry configured to couple to a process control loop and control electrical current through the loop to transmit process-related information; and
    loop override circuitry, separate from the output circuitry configured to override the control of electrical current through the loop by the output circuitry and set the electrical current through the loop to a desired current level.

2. The apparatus of claim 1 including diagnostic circuitry configured to detect an alarm condition and responsively actuate the loop override circuitry.

3. The apparatus of claim 2 wherein the diagnostic circuitry measures a quiescent current level.

4. The apparatus of claim 2 wherein the diagnostic circuitry includes a sense resistor connected in series with the loop.

5. The apparatus of claim 2 wherein the diagnostic circuitry includes an analog to digital converter.

6. The apparatus of claim 2 wherein the diagnostic circuitry monitors trends in the current.

7. The apparatus of claim 2 wherein the diagnostic circuitry includes a microcontroller.

8. The apparatus of claim 1 wherein the process device is a process variable transmitter.

9. The apparatus of claim 1 wherein the process device is a process controller.

10. The apparatus of claim 1 wherein the process device is configured for use in a Safety Instrumented System.

11. The apparatus of claim 1 wherein the desired current level is more than 21 mA or less than 3.8 mA.

12. The apparatus of claim 1 wherein the loop override circuitry includes a microcontroller.

13. The apparatus of claim 1 wherein the process device is completely powered with power received through the process control loop.

14. The apparatus of claim 1 wherein the process control loop operates in accordance with the HART® protocol.

15. The apparatus of claim 1 including a comparator configured to actuate the loop override circuitry if the loop current is outside of a predetermined threshold level.

16. The apparatus of claim 1 wherein the loop override circuitry is connected in parallel with the output circuitry.

17. The apparatus of claim 1 wherein the loop override circuitry is connected in series with the output circuitry.

18. The apparatus of claim 1 wherein the loop override circuitry is configured to disconnect the output circuitry from the process control loop.

19. The apparatus of claim 1 wherein the loop override circuitry is configured to shunt current across the output circuitry.

20. The apparatus of claim 1 including a watch dog circuit configured to activate the loop override circuitry.

21. The apparatus of claim 1 including a microcontroller configured to activate the loop override circuitry.

22. The apparatus of claim 21 wherein the microcontroller activates the loop override circuitry based upon trends in the loop current.

23. The apparatus of claim 21 wherein the microcontroller actuates the loop override circuitry based upon a comparison of the loop current with an expected value of the loop current.

24. The apparatus of claim 1 including circuitry configured to disconnect circuitry within the process device.

25. The apparatus of claim 1 wherein the loop override circuitry is configured to disconnect the output circuitry and control the loop current level.

26. The apparatus of claim 25 wherein the loop current level is controlled by a redundant output circuit.

27. The apparatus of claim 1 wherein the process device is configured for use in a Safety Instrumented System (SIS).

28. The apparatus of claim 1 and further comprising a sensor configured to sense a process variable.

29. The apparatus of claim 28 wherein the process device is a process variable transmitter.

30. The apparatus of claim 1 wherein the output circuitry is configured to operate in accordance with one of the group of communication protocols consisting of Fieldbus, Profibus and HART®.

31. The apparatus of claim 1 wherein the output circuitry is configured to couple to a process control loop type selected from the group consisting of two-wire, three-wire and four-wire.

32. The apparatus of claim 1 wherein the loop override circuitry is further configured to electrically disconnect the process device from the process control loop.

33. A method implemented in a process device of sending a desired current signal on a process control loop, comprising:
    controlling loop current in the process control loop based upon a sensed process variable with output circuitry in a device coupled to the process control loop;
    detecting an alarm condition in the process device coupled to the process control loop;
    overriding control of the loop current by the output circuitry in the device in response to a detected alarm condition; and
    controlling the loop current to a desired level during the step of overriding.

34. The method of claim 33 wherein the alarm condition is related to quiescent current draw.

35. The method of claim 34 wherein detecting includes detecting trends in the quiescent current draw.

36. The method of claim 33 wherein the desired current level is more than 21 mA or less than 3.8 mA.

37. The method of claim 33 wherein the step of overriding is implemented in a microcontroller.

38. The method of claim 33 wherein the step of detecting is implemented in a microcontroller.

39. The method of claim 33 including completely powering the process device with power received through the process control loop.

40. The method of claim 33 wherein the process control loop operates in accordance with the HART® protocol.

41. The method of claim 33 wherein the step of detecting includes comparing a current to a predetermined threshold level.

42. The method of claim 33 wherein the step of overriding includes disconnecting output circuitry from the process control loop.

43. The method of claim 42 and further comprising controlling the loop current level with a redundant output circuit.

44. The method of claim 33 wherein the step of controlling includes shunting current across output circuitry.

45. The method of claim 33 wherein the step of detecting includes monitoring trends in the loop current.

46. The method of claim 33 wherein the step of detecting includes comparing the loop current with an expected value of the loop current.

47. A process device implementing the method of claim 33.

48. The method of claim 33 and further comprising sensing the process variable.

49. The method of claim 33 and further comprising communicating over the process control loop in accordance with a protocol selected from the group of protocols consisting of Fieldbus, Profibus, and HART®.

50. The method of claim 33 implemented in a device configured for use in a Safety Instrumented System.

* * * * *